United States Patent
Takeuchi et al.

(10) Patent No.: US 7,540,192 B2
(45) Date of Patent: Jun. 2, 2009

(54) PHYSICAL QUANTITY SENSOR HAVING OPTICAL PART AND METHOD FOR MANUFACTURING THE SAME

(75) Inventors: Yukihiro Takeuchi, Nishikamo-gun (JP); Junji Oohara, Nisshin (JP)

(73) Assignee: DENSO CORPORATION, Kariya (JP)

( * ) Notice: Subject to any disclaimer, the term of this patent is extended or adjusted under 35 U.S.C. 154(b) by 338 days.

(21) Appl. No.: 11/505,386

(22) Filed: Aug. 17, 2006

(65) Prior Publication Data

US 2007/0069318 A1    Mar. 29, 2007

(30) Foreign Application Priority Data

Sep. 9, 2005    (JP)    ............................. 2005-261577

(51) Int. Cl.
*G01P 15/125*    (2006.01)
(52) U.S. Cl. .................. 73/514.32; 73/514.26; 438/48; 438/50; 438/52; 257/414; 257/415; 257/432
(58) Field of Classification Search ............. 73/514.32, 73/514.26; 257/415, 432, 436; 438/48, 50, 438/52

See application file for complete search history.

(56) References Cited

U.S. PATENT DOCUMENTS

| | | | |
|---|---|---|---|
| 6,272,926 B1 * | 8/2001 | Fehrenbach et al. ...... 73/514.32 |
| 6,281,033 B1 * | 8/2001 | Uayanagi et al. .............. 438/50 |
| 6,494,096 B2 | 12/2002 | Sakai et al. |
| 6,686,638 B2 * | 2/2004 | Fischer et al. ............... 257/415 |
| 2002/0135033 A1 | 9/2002 | Hara et al. |
| 2003/0124758 A1 * | 7/2003 | Adams et al. ................. 438/48 |
| 2004/0173862 A1 | 9/2004 | Oohara et al. |
| 2004/0183149 A1 | 9/2004 | Schenk |
| 2007/0019406 A1 | 1/2007 | Oohara et al. |

OTHER PUBLICATIONS

Office Action dated Oct. 30, 2008 in corresponding German patent application No. 10 2006 041 995.2-52 (and English translation).

* cited by examiner

*Primary Examiner*—David Vu
*Assistant Examiner*—Brandon Fox
(74) *Attorney, Agent, or Firm*—Posz Law Group, PLC (57) ABSTRACT

A method for manufacturing a physical quantity sensor having a movable portion, a support portion and an optical part is provided. The method includes steps of: etching a silicon substrate so that a movable-portion-to-be-formed portion, a support-portion-to-be-formed portion, and an optical-part-to-be-formed portion having a plurality of columns and trenches are formed; oxidizing the optical-part-to-be-formed portion so that each column changes to a silicon oxide column and the trench is filled with a silicon oxide layer; and removing a part of the movable-portion-to-be-formed portion connecting to the silicon substrate so that the movable portion is separated from the silicon substrate.

23 Claims, 9 Drawing Sheets

PHYSICAL QUANTITY SENSOR HAVING OPTICAL PART AND METHOD FOR MANUFACTURING THE SAME

CROSS REFERENCE TO RELATED APPLICATION

This application is based on Japanese Patent Application No. 2005-261577 filed on Sep. 9, 2005, the disclosure of which is incorporated herein by reference.

FIELD OF THE INVENTION

The present invention relates to a physical quantity sensor having an optical part and a method for manufacturing the same.

BACKGROUND OF THE INVENTION

A physical quantity sensor detects physical quantity such as acceleration and angular speed. The sensor includes a fixed electrode and a movable portion. The fixed electrode is formed on a silicon substrate. The movable portion is displaceable in accordance with the physical quantity applied to the sensor. A movable electrode is formed in the movable portion, and the movable electrode faces the fixed electrode. The sensor detects the physical quantity on the basis of a capacitance change between the fixed electrode and the movable electrode. The sensor is disclosed in, for example, JP-A-2001-330623, which corresponds to U.S. Pat. No. 6,494,096.

However, a static electrical charge generated in the movable portion or the like provides electric noise, so that the noise transmits a detection side through the substrate. Thus, detection accuracy of the sensor is reduced. In view of this difficulty, it is considered that the sensor detects the physical quantity on the basis of intensity change of a reflected light, which is reflected on the movable portion. In this case, the sensor can detect the physical quantity with high detection accuracy. Specifically, the light is emitted toward the movable portion so that the light is reflected by the movable portion. Thus, the sensor can detect the physical quantity accurately even when the electric noise is generated in the sensor.

The above optical type physical quantity sensor is integrally formed on the silicon substrate by using a micro electrical mechanical system method (i.e., MEMS method). Specifically, the movable portion and optical parts such as a lens, a prism and an optical waveguide are integrated on the substrate. Accordingly, the sensor has small dimensions and a low manufacturing cost.

However, it is necessary to form the movable portion and the optical parts independently. Thus, a manufacturing efficiency of the sensor is low.

SUMMARY OF THE INVENTION

In view of the above-described problem, it is an object of the present disclosure to provide a physical quantity sensor having an optical part. It is another object of the present disclosure to provide a method for manufacturing a physical quantity sensor having an optical part.

According to an aspect of the present disclosure, a method for manufacturing a physical quantity sensor, which includes a movable portion, a support portion and an optical part, is provided. The movable portion is movable in a predetermined direction in accordance with a physical quantity applied to the sensor. The movable portion is movably supported on the support portion. The optical part irradiates a light to the movable portion, the light emitted from an external light emitting device and entered into the optical part. The physical quantity is detected on the basis of detection of the light reflected on the movable portion, the detection performed by an external light detector. The method includes steps of: etching a silicon substrate so that a movable-portion-to-be-formed portion, a support-portion-to-be-formed portion, and an optical-part-to-be-formed portion are formed on the silicon substrate, wherein the movable-portion-to-be-formed portion provides the movable portion, the support-portion-to-be-formed portion provides the support portion, and the optical-part-to-be-formed portion provides the optical part, and wherein the optical-part-to-be-formed portion includes a plurality of columns, which are disposed in parallel each other and have a trench between two neighboring columns; oxidizing the optical-part-to-be-formed portion so that each column changes to a silicon oxide column and the trench is filled with a silicon oxide layer; and removing a part of the movable-portion-to-be-formed portion connecting to the silicon substrate so that the movable portion is separated from the silicon substrate and the movable portion is movably supported on the support portion.

In the above method, the movable portion, the support portion and the optical part are formed on the same silicon substrate. Thus, manufacturing efficiency of the sensor is increased.

According to a second aspect of the present disclosure, a physical quantity sensor for detecting a physical quantity includes: a silicon substrate; a light emitting element for emitting a light; an optical part for irradiating the light from the light emitting element as an irradiation light; a movable portion having a reflection surface, wherein the reflection surface reflects the irradiation light as a reflection light, and wherein the movable portion is movable in accordance with the physical quantity applied to the sensor so that an incident angle of the irradiation light with respect to the reflection surface is changed; a support portion for movably supporting the movable portion on the silicon substrate; and a detection element for detecting a change of the reflection light in order to detect the physical quantity. The optical part is made of silicon oxide, and integrated with the silicon substrate. The support portion is made of silicon, and integrated with the silicon substrate. The movable portion is made of silicon, and integrated with the silicon substrate through the support portion. The optical part has a top surface opposite to the silicon substrate. The movable portion has a top surface opposite to the silicon substrate. The top surface of the movable portion and the top surface of the optical part are disposed on almost a same plane.

In the above device, the sensor is easily manufactured so that manufacturing efficiency of the sensor is increased.

According to a third aspect of the present disclosure, a physical quantity sensor for detecting a physical quantity includes: a silicon substrate; a light emitting element for emitting a light; an optical part for irradiating the light from the light emitting element as an irradiation light; a movable portion having a reflection surface, wherein the reflection surface reflects the irradiation light as a reflection light, and wherein the movable portion is movable in accordance with the physical quantity applied to the sensor so that an incident angle of the irradiation light with respect to the reflection surface is changed; a support portion for movably supporting the movable portion on the silicon substrate; and a detection element for detecting a change of the reflection light in order to detect the physical quantity. The optical part is made of silicon oxide, and integrated with the silicon substrate. The support portion is made of silicon, and integrated with the silicon substrate. The movable portion other than the reflection surface is made of silicon, and integrated with the silicon substrate through the support portion. The reflection surface of the movable portion is made of silicon oxide.

In the above device, the sensor is easily manufactured so that manufacturing efficiency of the sensor is increased.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
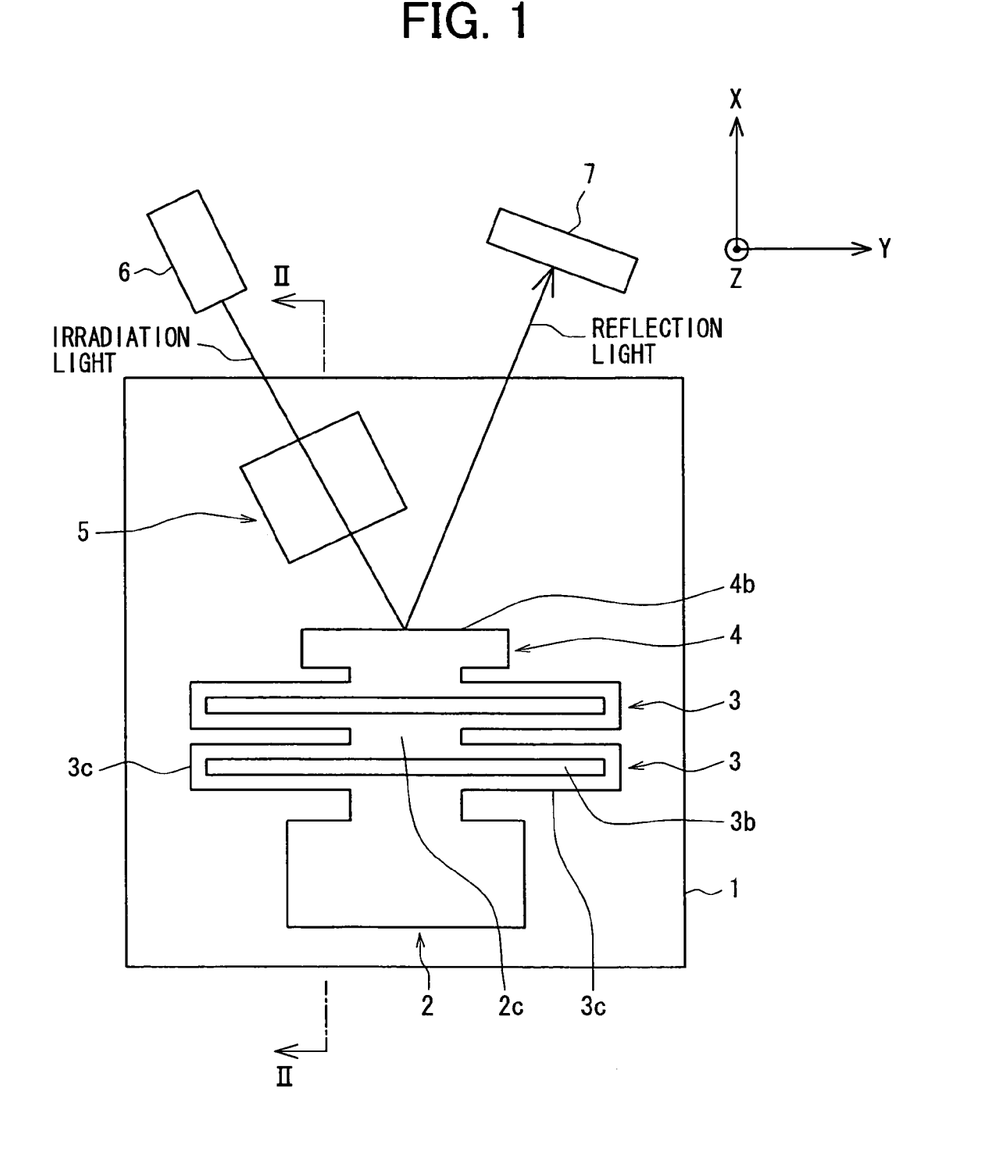
FIG. 1 is a plan view showing a physical quantity sensor according to a first embodiment.

A method for manufacturing a physical quantity sensor according to an embodiment is explained below. The sensor includes, for example, a micro lens as an optical part. In FIG. 1, an axis X represents a forward direction, an axis Y represents a right direction, and an axis Z represents an upward direction. A direction opposite to the axis X represents a backward direction, a direction opposite to the axis Y represents a left direction, and a direction opposite to the axis Z represents a downward direction.

Figure 2:
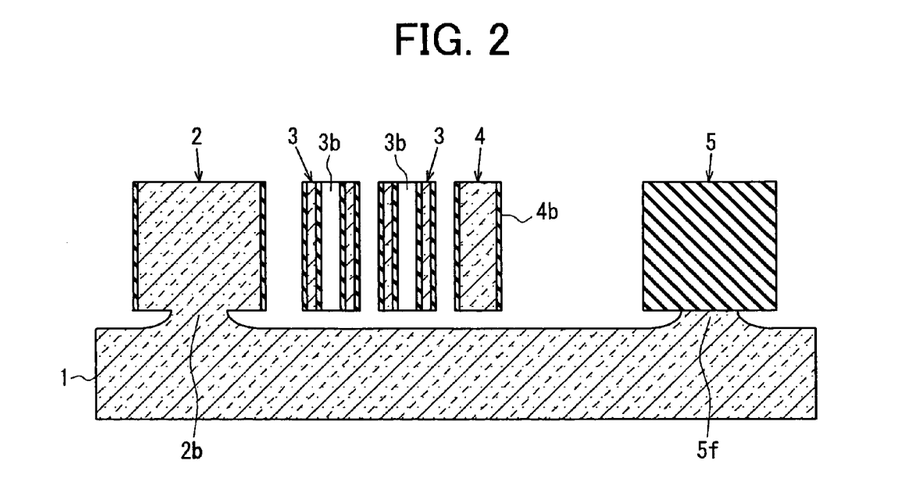
FIG. 2 is a cross sectional view showing the sensor taken along line II-II in FIG. 1.
Figure 5:
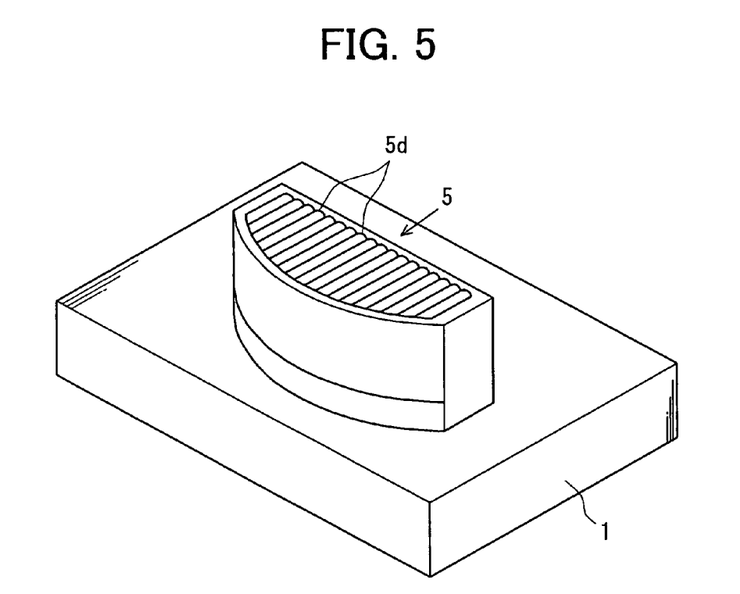
FIG. 5 is a perspective view showing a micro lens of the sensor according to the first embodiment.

The sensor is shown in FIGS. 1 and 2. The sensor includes a support portion 2, which is formed on a surface of a silicon substrate 1. A beam 3 and a movable portion 4 are movably supported with the support portion 2. Specifically, the movable portion 4 is supported by the support portion 2 through the beam 3. A micro lens 5 is formed on the surface of the substrate 1, and disposed near the movable portion 4. Thus, the physical quantity sensor includes the support portion 2, the beam 3, the movable portion 4 and the micro lens 5. As shown in FIG. 5, the micro lens 5 is a cylindrical lens having a flat surface and a convexity surface. The flat surface provides an entrance plane of a light, and the convexity surface provides an output surface of the light. Thus, the micro lens is a plane-convex lens.

A light emitting device 6 as a light emitting element emits the light. The emitted light from the device 6 is collimated by the micro lens 5. Then, the collimated light is reflected on a reflection surface 4b of the movable portion 4. The reflected light is received by a light receiving device 7. The light receiving device 7 connects to a detection device (not shown). The detection device detects a phase change or an intensity of the received light. The detection device and the light receiving device 7 provide a detection element.

The light emitting device 6 is, for example, a laser diode, a light emitting diode or the like. The light receiving device 7 is, for example, a photo diode, a photo transistor, a CdS cell, a CdSe cell, a CCD (i.e., a charge coupled device) or the like. Although the optical part is the micro lens 5, the optical part may be a plane-concave lens, a biconcave lens, a meniscus lens, an optical waveguide, a prism or the like.

As shown in FIG. 2, the support portion 2 is integrally connected to the surface of the substrate 1 through a base portion 2b. The micro lens 5 is integrally connected to the substrate 1 through a base portion 5f. The beam 3 and the movable portion 4 are isolated from the surface of the substrate 1. The support portion 2, the beam 3, the movable portion 4 and the micro lens 5 are formed by etching the substrate 1. The beam 3 supports the movable portion 4 by connecting to the support portion 2. The beam 3 has a spring function. The movable portion 4 integrally formed with the beam 3 is displaceable in accordance with inertia force. Specifically, the movable portion 3 is movable in a forward-backward direction, a right-left direction or an upward-downward direction, which corresponds to the applied direction of the inertia force.

A weight portion 2c is integrally formed in front of the support portion 2. The beam 3 protrudes from each side of the weight portion 2c in the lateral direction of the substrate 1. The beam 3 has a comb-teeth shape. The beam 3 includes multiple right side beams 3c and multiple left side beams 3c. Each of a pair of a right side beam 3c and a left side beam 3c symmetrically protrudes from a right side or a left side of the substrate 1, respectively. A though hole 3b is formed in a pair of the right and left side beams 3c. The through hole 3b penetrates the beam 3 in a vertical direction of the substrate 1.

The movable portion 4 has a plate shape. A side of the plate shape of the movable portion 4 as a backside faces the weight portion 2c, and is integrally formed with the beam 3. The other side of the plate shape of the movable portion 4 as a front side is a reflection surface 4b, which faces forward. Further, the reflection surface 4b is perpendicular to the substrate 1. The beam 3 may have another shape other than the shape shown in FIG. 1 as long as the movable portion 4 is movable in accordance with the applied physical quantity. The movable portion 4 may have another shape other than the shape shown in FIG. 1 as long as the movable portion 4 is movable in accordance with the physical quantity so as to change a reflection light reflected on the reflection surface 4b.

Figure 3A:
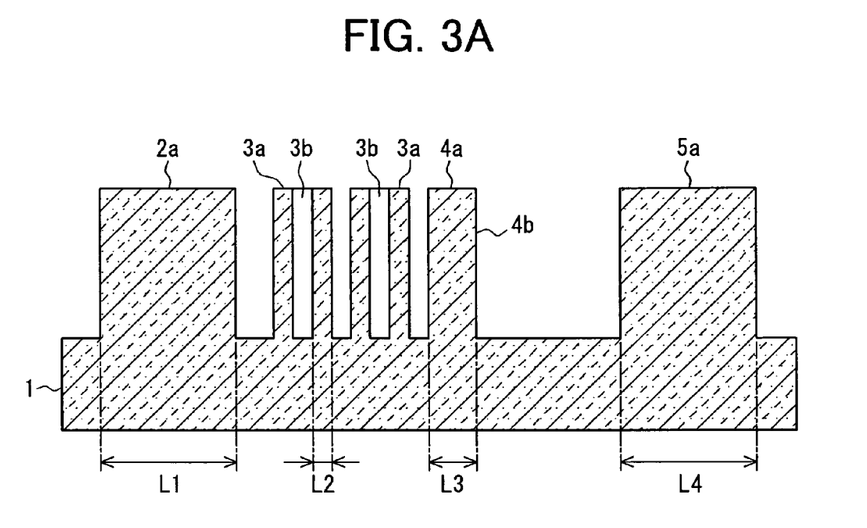
FIGS. 3A and 3B are cross sectional views explaining a method for manufacturing the sensor according to the first embodiment.
Figure 3B:
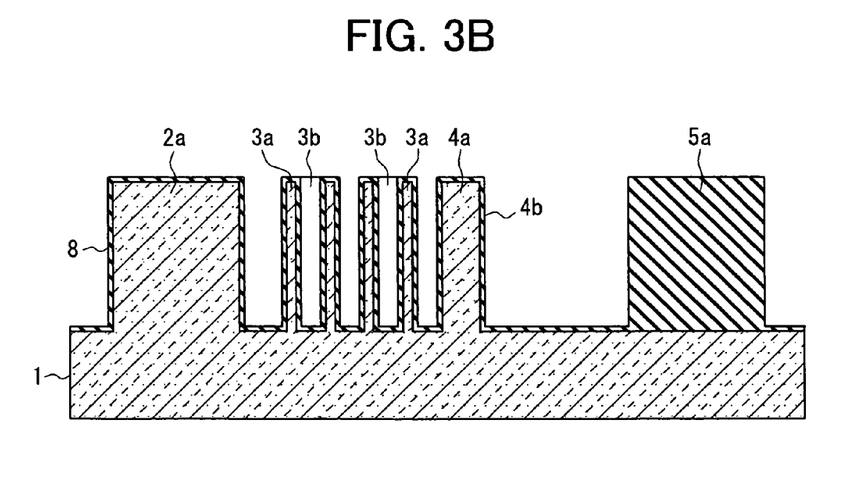
Figure 4A:
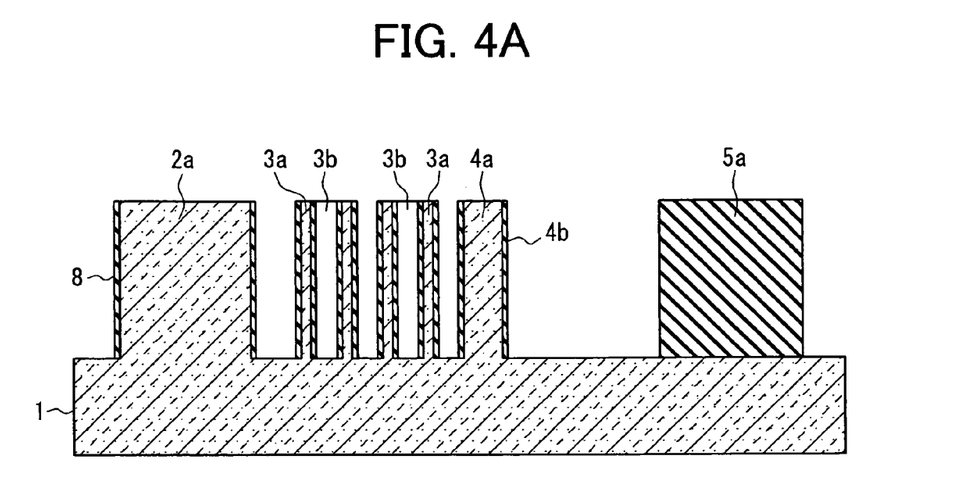
FIGS. 4A and 4B are cross sectional views explaining the method for manufacturing the sensor according to the first embodiment.
Figure 4B:
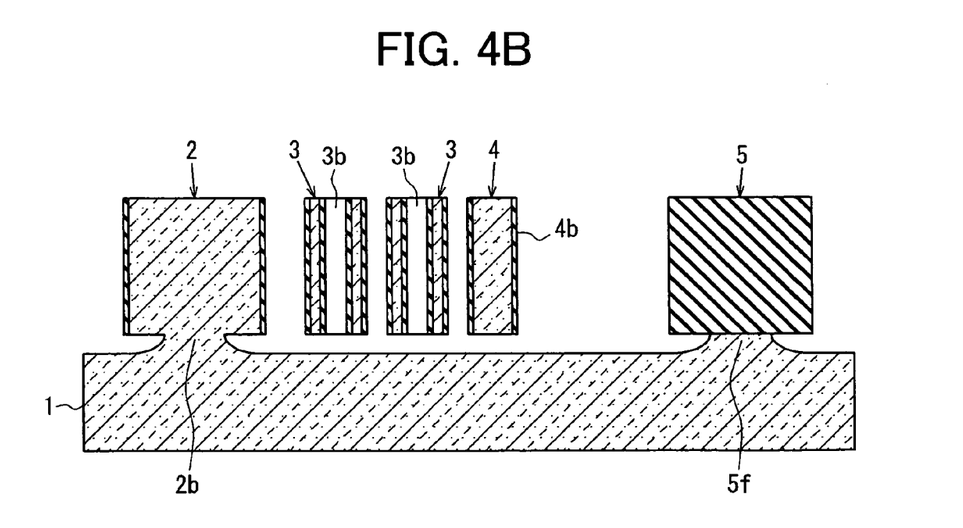
Figure 6:
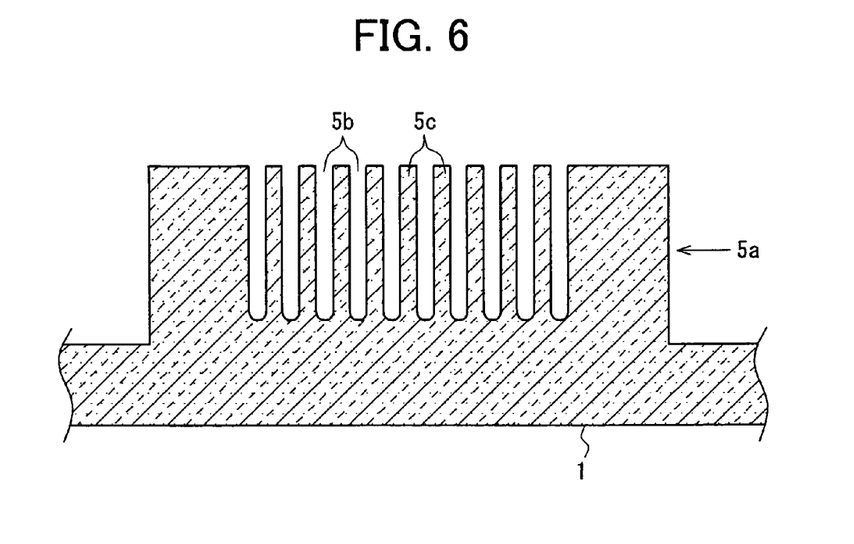
FIG. 6 is a cross sectional view showing an optical-part-to-be-formed portion after a first etching step, according to the first embodiment.
Figure 7:
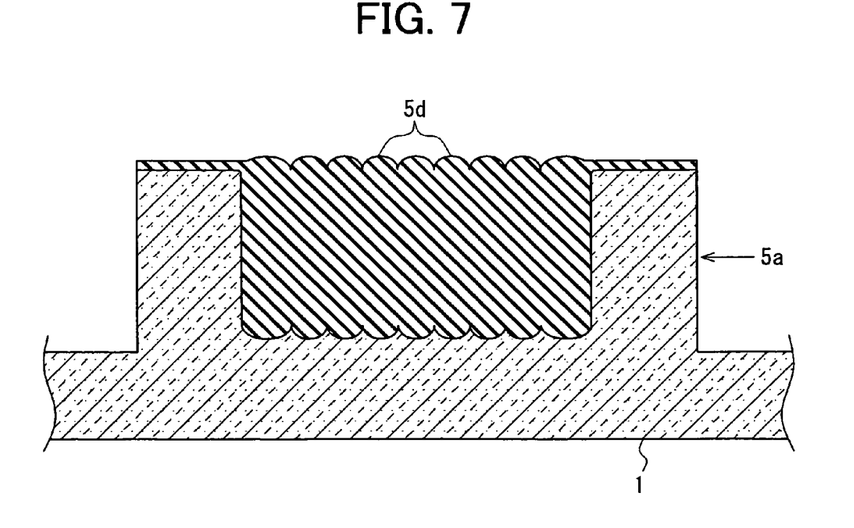
FIG. 7 is a cross sectional view showing the optical-part-to-be-formed portion after a thermal oxidation step, according to the first embodiment.
Figure 8:
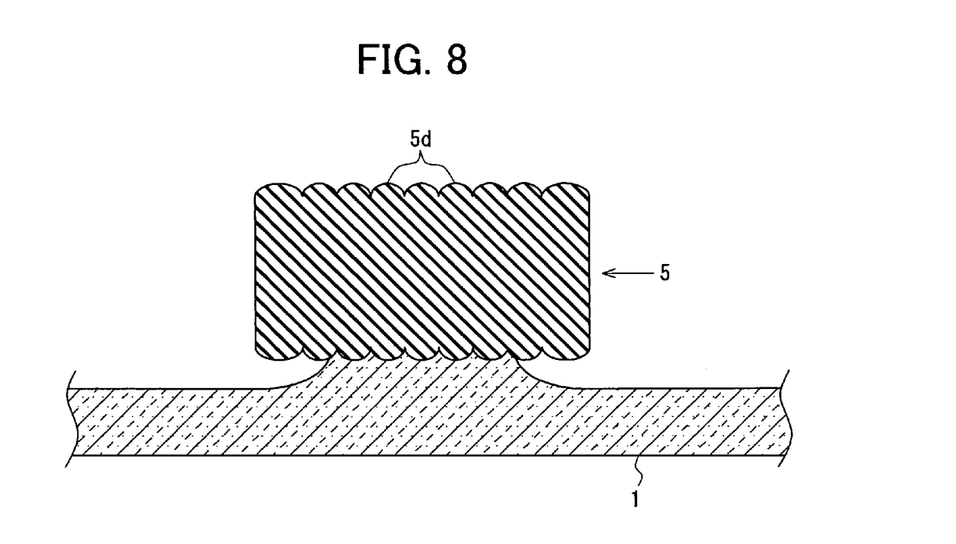
FIG. 8 is a cross sectional view showing the micro lens after a second etching step, according to the first embodiment.

Next, a manufacturing method of the sensor is explained with reference to FIGS. 3A to 8. FIG. 3A shows a first etching step, and FIG. 3B shows a thermal oxidation step. FIGS. 4A and 4B show a second etching step. FIG. 5 shows the micro lens, and FIG. 6 shows a step of forming the optical part. Specifically, FIG. 6 shows an optical-part-to-be-formed portion. FIG. 7 shows the optical-part-to-be-formed portion after the thermal oxidation step. FIG. 8 shows the micro lens as the optical part after the second etching step.

Here, a movable-portion-to-be-formed portion is a base portion for forming the movable portion 4, a support-portion-to-be-formed portion is a base portion for forming the support portion 2, the optical-part-to-be-formed portion is a base portion for forming the micro lens 5, and a beam-to-be-formed portion is a base portion for forming the beam 3.

[First Etching Step]

An etching mask is prepared to have a predetermined pattern corresponding to an outline of each portion. The mask is formed on the surface of the substrate 1. The substrate 1 is etched from the surface of the substrate 1 so that the movable-portion-to-be-formed portion 4a, the support-portion-to-be-formed portion 2a, the optical-part-to-be-formed portion 5a and the beam-to-be-formed portion 3a are formed on the substrate 1, as shown in FIG. 3A.

The optical-part-to-be-formed portion 5a has a construction that multiple columns 5c are disposed in parallel each other, and a trench 5b as a groove is disposed between two columns 5c. The trench 5b has a large aspect ratio, which represents a ratio between a width of the trench 5b and a depth of the trench 5b. Each column 5c has a thin plate shape. A side of the column 5c extending in a longitudinal direction of the plate shape provides a sidewall of the trench 5b. The longitudinal direction of the plate shape is parallel to a light axis of the optical part, i.e., the micro lens 5. Thus, an angle of the light passing through the micro lens 5 is within a total reflection angle between the column 5c and air, so that light transmission through the micro lens 5 is prevented from reducing. Here, the reduction of the light transmission is caused by, for example, light scattering.

The width of each trench 5b is determined in such a manner that a silicon oxide layer formed on the sidewall of each trench 5b in the next thermal oxidation step fills the trench 5b without clearance after the thermal oxidation step is performed. In this embodiment, since an etching speed is large, the surface of the substrate 1 is etched by an ICP (i.e., inductively coupled plasma) etching method. Thus, a process time of the etching step is reduced.

[Thermal Oxidation Step]

Next, the substrate 1 is thermally oxidized so that all surface of the portions of the substrate 1 and the surface of the substrate 1 are replaced to a silicon oxide layer 8. As shown in FIG. 7, the column 5c of the optical-part-to-be-formed portion 5a is replaced to an oxide column 5d made of silicon oxide after the thermal oxidation step is performed. Further, the trench 5b is embedded with the silicon oxide layer formed on the sidewall of the trench 5b so that the silicon oxide layer fills the trench 5b. Thus, the oxide column 5d and the silicon oxide layer provide the micro lens 5 without clearance. Here, if the clearance is disposed in the micro lens 5, diffraction of the light is occurred so that efficiency of the micro lens 5 is reduced. However, since the micro lens 5 is formed without the clearance, efficiency of the micro lens 5 is improved.

[Second Etching Step]

Next, a part of the silicon oxide layer 8 disposed on the surface of the substrate 1 is removed by the second etching step, as shown in FIG. 4A. Further, the second etching step continues to perform until the movable-portion-to-be-formed portion 4a and the beam-to-be-formed portion 3a are separated from the surface of the substrate 1, as shown in FIG. 4B. In this case, a portion under the movable portion 4 or the beam 3 is removed. A portion under the support portion 2 or the micro lens 5 connecting to the substrate 1 is partially etched, and a center of the portion under the support portion 2 or the micro lens 5 remains to connect to the substrate 1. Specifically, although a periphery of the portion under the support portion 2 or the micro lens 5 is eliminated, the center of the portion under the support portion 2 or the micro lens 5 remains as the base portion 2b of the support portion 2 or the base portion 5f of the micro lens 5, respectively.

As shown in FIG. 3A, a width L1 of the support-portion-to-be-formed portion 2a and a width L4 of the optical-part-to-be-formed portion 5a, each of which is a width of a portion connecting to the substrate 1, are wider than a width L2 of the beam-to-be-formed portion 3a and a width L3 of the movable-portion-to-be-formed portion 4a. Specifically, the width L1 of the support-portion-to-be-formed portion 2a is larger than the width L2 of the beam-to-be-formed portion 3a, and larger than the width L3 of the movable-portion-to-be-formed portion 4a. The width L4 of the optical-part-to-be-formed portion 5a is larger than the width L2 of the beam-to-be-formed portion 3a, and larger than the width L3 of the movable-portion-to-be-formed portion 4a. Therefore, the portion under the movable portion 4 or the beam 3 connecting to the substrate 1 is removed, and the center of the portion under the support portion 2 or the micro lens 5 remains to connect to the substrate 1 although the periphery of the portion under the support portion 2 or the micro lens 5 is removed.

Thus, the movable portion 4 and the beam 3 are separated from the substrate 1 so that the movable portion 4 is movably supported on the support 2 through the beam 3, as shown in FIG. 4B. In this second etching step, since the etching proceeds in the lateral direction of the surface of the substrate 1, the lateral direction which is parallel to the substrate 1, a $XeF_2$ gas as a reaction gas is used in the second etching step.

Thus, the movable portion 4, the beam 3, the support portion 2 and the micro lens 5 are formed on the substrate 1 by the same manufacturing method. Accordingly, manufacturing efficiency of the sensor is increased. Further, in the second etching step, since the movable portion 4 and the beam 3 are separated from the substrate 1 and the center of the portion of the support portion 2 or the micro lens 5 remains, all surface of the substrate 1 is etched simultaneously. Accordingly, it is not necessary to etch only the portion of the movable-portion-to-be-formed portion 4a or the beam-to-be-formed portion 3a for separating them from the substrate 1. Thus, the second etching step is easily performed.

Second Embodiment

Figure 9A:
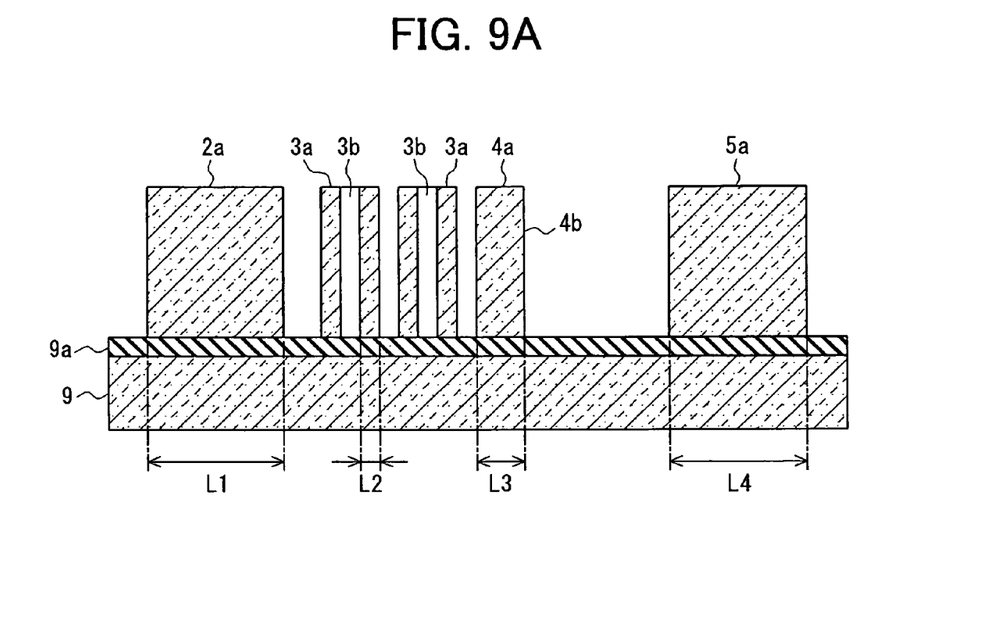
FIGS. 9A and 9B are cross sectional views explaining another method for manufacturing a physical quantity sensor according to a second embodiment.
Figure 9B:
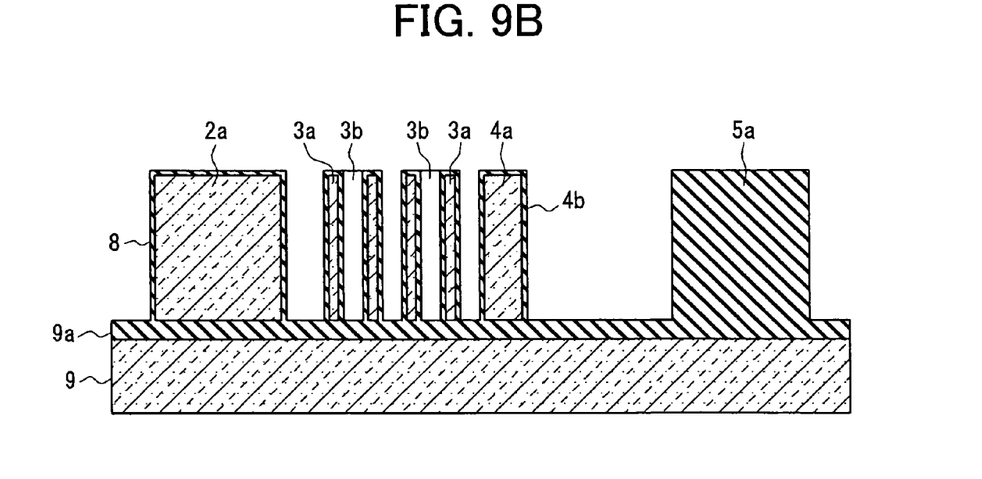
Figure 10A:
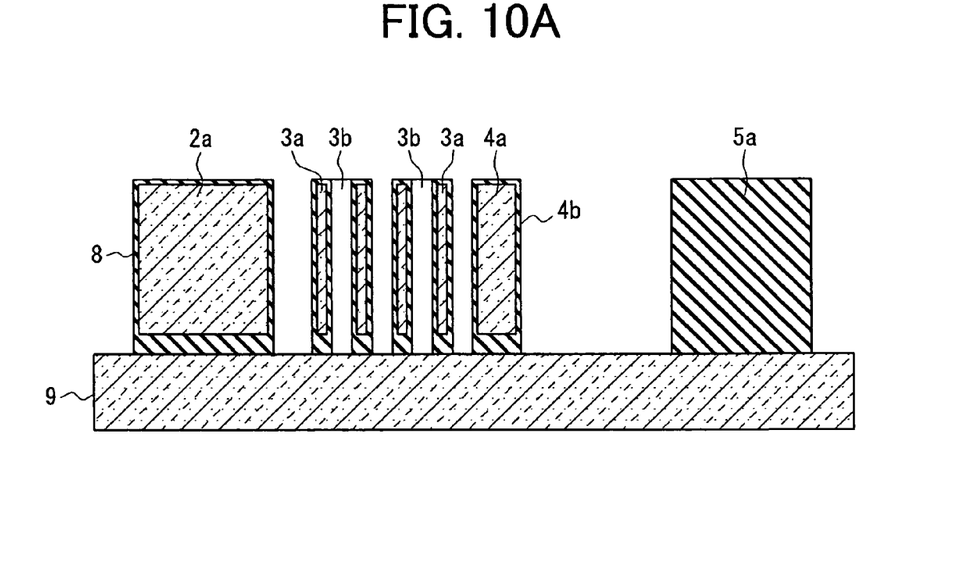
FIGS. 10A and 10B are cross sectional views explaining the method for manufacturing the physical quantity sensor according to the second embodiment.
Figure 10B:
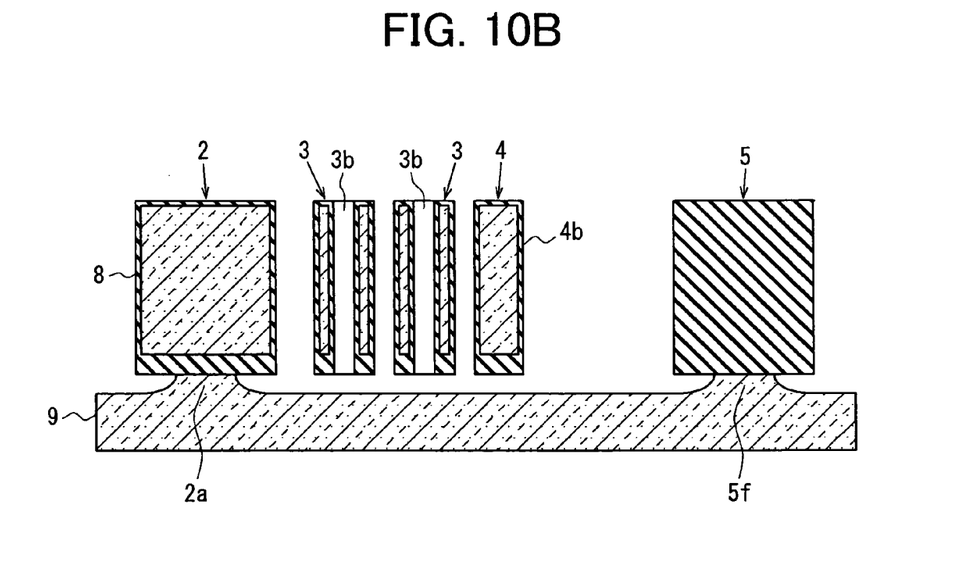

Although the substrate 1 is made of silicon, the substrate 1 may be made of a SOI substrate, for example, as shown in FIGS. 9A to 10B. FIG. 9A shows a first etching step, and FIG. 9B shows a thermal oxidation step. FIGS. 10A and 10B show a second etching step.

Firstly, an etching mask is prepared to have a predetermined pattern corresponding to an outline of each portion. The mask is formed on the surface of the SOI substrate 9. The substrate 9 is etched from the surface of the substrate 9 so that the movable-portion-to-be-formed portion 4a, the support-portion-to-be-formed portion 2a, the optical-part-to-be-formed portion 5a and the beam-to-be-formed portion 3a are formed on the substrate 9, as shown in FIG. 9A. Specifically, each of the movable-portion-to-be-formed portion 4a, the support-portion-to-be-formed portion 2a, the optical-part-to-be-formed portion 5a and the beam-to-be-formed portion 3a are formed on an embedded silicon oxide layer 9a, which constitutes the SOI substrate 9.

Then, the thermal oxidation step shown in FIG. 9B and the second etching step shown in FIGS. 10A and 10B are performed. Thus, the portion of the movable-portion-to-be-formed portion 4a and the beam-to-be-formed portion 3a are removed from the substrate 1. Thus, the movable portion 4 is movably supported on the support portion 2 through the beam 3. Further, the base portion 2b of the support portion 2 and the base portion 5f of the micro lens 5 remains to connect to the substrate 1 so that the support portion 2 and the micro lens 5 are integrated with the substrate 9.

Thus, the sensor is formed from the SOI substrate 9. In this case, manufacturing efficiency of the sensor is increased. Further, in the second etching step, since all surface of the substrate 1 is etched simultaneously, the second etching step is easily performed.

In general, the etching performance is varied in the surface of the substrate 1. Specifically, a dry etching performance such as the ICP etching performance has dispersion of an etching depth, since an etching rate of an opening having large dimensions to be etched from the opening is larger than that of an opening having small dimensions. Thus, each height of the micro lens 5, the beam 3 and the movable portion 4 is different. Here, in case of the SOI substrate 9, the etching process is stopped when an etching surface reaches the silicon oxide layer 9a. This is because the etching rate of the silicon oxide layer 9a is a hundred times or more smaller than the etching rate of the silicon in case of using, for example, an ICP etcher. Thus, the thickness of the silicon layer disposed on the silicon oxide layer 9a is set to be a predetermined thickness, and the etching is stopped after the etching surface near a portion having a small etching rate reaches the silicon oxide layer 9a. In this case, each height of the micro lens 5, the beam 3 and the movable portion 4 becomes homogeneous without depending on the dimensions of the opening of the mask and without dispersion of the height.

Third Embodiment

Figure 11:
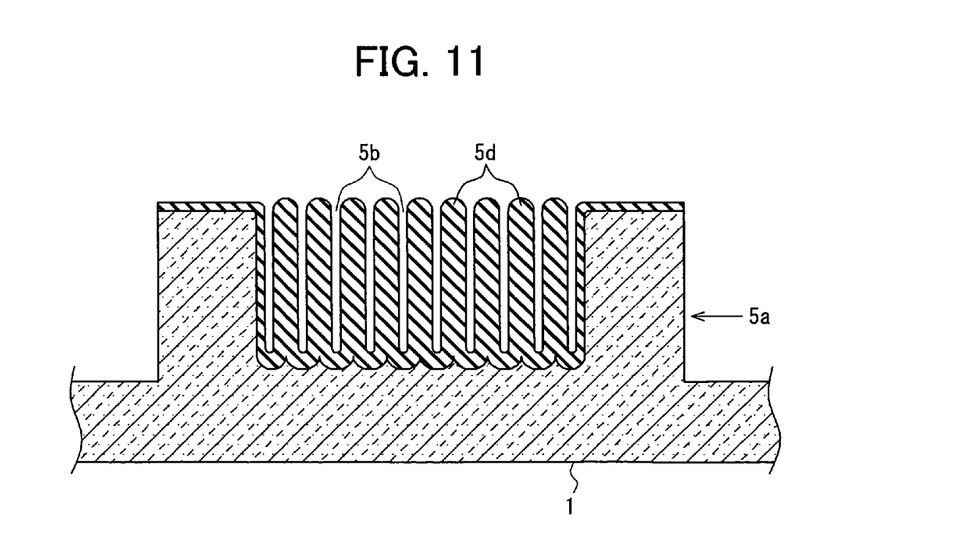
FIG. 11 is a cross sectional view showing an optical-part-to-be-formed portion after a thermal oxidation step, according to a third embodiment.

The micro lens 5 may be formed by using supercritical fluid. As shown in FIG. 11, in the thermal oxidation step, the trench 5b is partially filled with the silicon oxide layer, and a groove as a part of the trench 5b remains between two oxide columns 5d. In this case, the trench 5b has an initial width before the thermal oxidation step, the initial width which is wider than the width of the trench 5b shown in FIG. 6. Alternatively, a process time of the thermal oxidation step is shortened so that the thickness of the silicon oxide layer formed on the sidewall of the trench 5b is thin. Further, an opening of the trench 5b disposed on the top of the trench 5b remains, i.e., is not covered with the silicon oxide layer.

Figure 12:
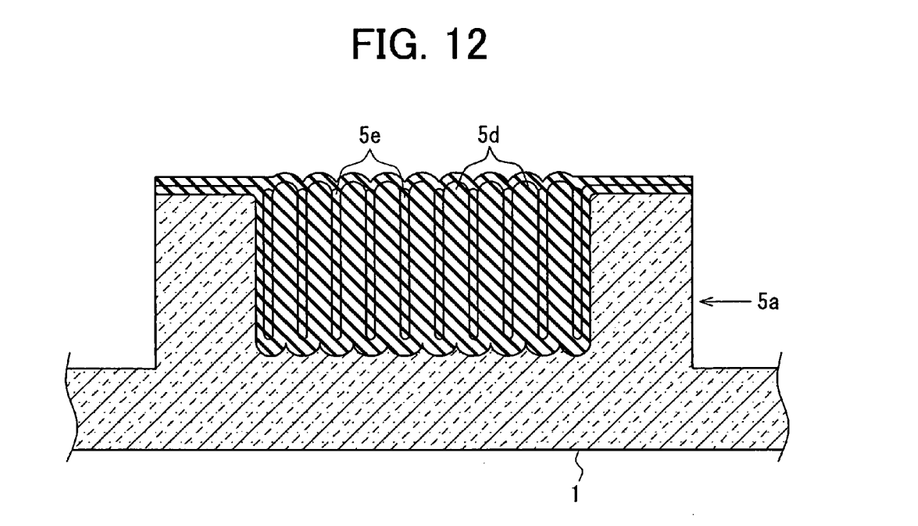
FIG. 12 is a cross sectional view showing the optical-part-to-be-formed portion after a supercritical fluid step, according to the third embodiment.

The supercritical fluid, in which silicon oxide dissolves, is introduced into the groove. In this case, a silicon oxide film is deposited on the inner wall of the groove. Thus, the groove, i.e., the trench 5b is filled with the silicon oxide film without clearance. As shown in FIG. 12, an embedded silicon oxide layer 5e made of the silicon oxide film is formed between two oxide columns 5d. The supercritical fluid includes carbon dioxide as a main component since the supercritical fluid including carbon dioxide has a low critical temperature and a low critical pressure. In this case, it is easy to prepare the supercritical fluid, and it is easy to control the supercritical fluid.

Here, the supercritical fluid has both of gas phase characteristics such as diffusivity and liquid phase characteristics such as solubility. Thus, the supercritical fluid is easily diffused, and capable of dissolving a component. Further, density of the supercritical fluid is continuously and largely changeable. Accordingly, each groove, i.e., each trench 5b can be filled with the silicon oxide film without clearance. Further, even when a concavity and a convexity are disposed on the inner wall of the groove or even when the opening of the trench 5b is narrowed, the supercritical fluid is introduced into the groove sufficiently. Thus, the trench 5b is embedded with the silicon oxide film.

Figure 13:
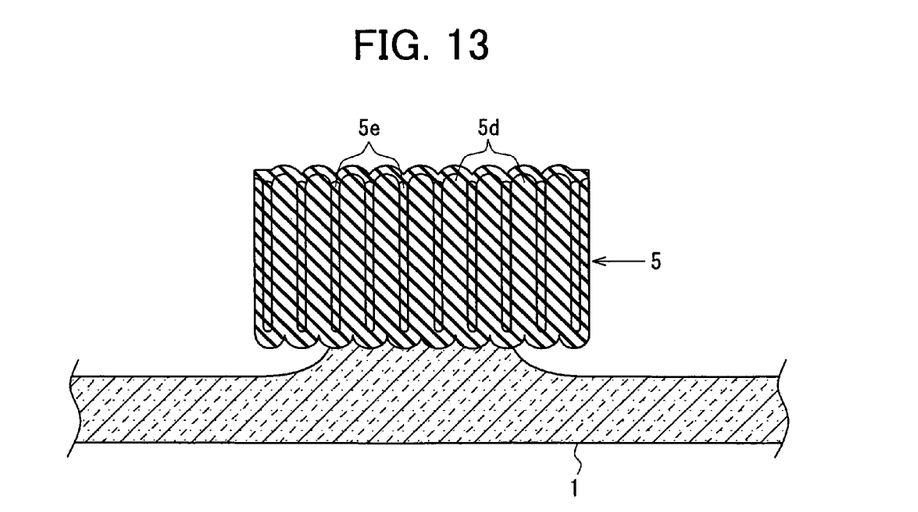
FIG. 13 is a cross sectional view showing a micro lens after a second etching step, according to the third embodiment.

Then, the second etching step is performed so that the micro lens 5 is formed, as shown in FIG. 13.

Although the silicon oxide dissolves in the supercritical fluid, another compound may dissolve in the supercritical fluid. The compound has almost the same refraction index as the silicon oxide. In this case, the trench 5b is filled with the compound without clearance. The compound is, for example, calcium fluoride, magnesium fluoride or alumina. The refraction index of the silicon oxide is in a range between 1.2 and 8. The refraction index of the calcium fluoride is in a range between 0.13 and 8, the refraction index of the magnesium fluoride is in a range between 0.21 and 10, and the refraction index of the alumina is in a range between 0.23 and 2. Thus, their refraction indexes are almost equal to the refraction index of the silicon oxide.

(Modifications)

A physical quantity sensor may include at least two of the micro lens, the optical waveguide and the prism. Further, a physical quantity sensor may include multiple pairs of two of the micro lens, the optical waveguide and the prism. In these cases, each sensor can be manufactured by the above method. Thus, manufacturing efficiency of each sensor is increased.

Further, when multiple optical parts are formed on the substrate 1 simultaneously, a light axis of each optical part coincides with each other. Accordingly, it is not necessary to adjust the light axis of each optical part after the optical parts are formed.

The above disclosure has the following aspects.

According to an aspect of the present disclosure, a method for manufacturing a physical quantity sensor, which includes a movable portion, a support portion and an optical part, is provided. The movable portion is movable in a predetermined direction in accordance with a physical quantity applied to the sensor. The movable portion is movably supported on the support portion. The optical part irradiates a light to the movable portion, the light emitted from an external light emitting device and entered into the optical part. The physical quantity is detected on the basis of detection of the light reflected on the movable portion, the detection performed by an external light detector. The method includes steps of: etching a silicon substrate so that a movable-portion-to-be-formed portion, a support-portion-to-be-formed portion, and an optical-part-to-be-formed portion are formed on the silicon substrate, wherein the movable-portion-to-be-formed portion provides the movable portion, the support-portion-to-be-formed portion provides the support portion, and the optical-part-to-be-formed portion provides the optical part, and wherein the optical-part-to-be-formed portion includes a plurality of columns, which are disposed in parallel each other and have a trench between two neighboring columns; oxidizing the optical-part-to-be-formed portion so that each column changes to a silicon oxide column and the trench is filled with a silicon oxide layer; and removing a part of the movable-portion-to-be-formed portion connecting to the silicon substrate so that the movable portion is separated from the silicon substrate and the movable portion is movably supported on the support portion.

In the above method, the movable portion, the support portion and the optical part are formed on the same silicon substrate. Thus, manufacturing efficiency of the sensor is increased.

Alternatively, the silicon substrate may be made of a SOI substrate. In this case, the height of the optical part and the height of the movable portion become homogeneously.

Alternatively, the support-portion-to-be-formed portion may have a width larger than a width of the movable-portion-to-be-formed portion, and the optical-part-to-be-formed portion may have a width larger than the width of the movable-portion-to-be-formed portion. In this case, only the movable portion is separated from the substrate, and the support portion and the optical part are integrally connected to the substrate.

Alternatively, in the step of removing the part of the movable-portion-to-be-formed portion, a part of the support-portion-to-be-formed portion may remain to integrally connect to the silicon substrate, and a part of the optical-part-to-be-formed portion may remain to integrally connect to the silicon substrate.

Alternatively, in the step of oxidizing the optical-part-to-be-formed portion, the silicon oxide layer and the silicon oxide column may be integrated so that the silicon oxide layer and the silicon oxide column provide the optical part. In the step of oxidizing the optical-part-to-be-formed portion, a silicon oxide film may be formed on a surface of the silicon substrate. In the step of removing the part of the movable-portion-to-be-formed portion, the silicon oxide film on the silicon substrate may be removed.

Alternatively, in the step of removing the part of the movable-portion-to-be-formed portion, the part of the movable-portion-to-be-formed portion connecting to the silicon substrate may be etched by using a $XeF_2$ gas.

Alternatively, in the step of oxidizing the optical-part-to-be-formed portion, the trench may be partially filled with the silicon oxide layer so that a groove remains between the silicon oxide columns. The method further includes a step of depositing a silicon oxide film in the groove to fill the groove with the silicon oxide film. Further, in the step of depositing the silicon oxide film, a supercritical fluid, in which a silicon oxide dissolves, may be introduced into the groove to deposit the silicon oxide film on an inner wall of the groove. Further, the supercritical fluid may include a main component made of carbon dioxide. Furthermore, in the step of oxidizing the optical-part-to-be-formed portion, the trench may be partially filled with the silicon oxide layer so that a groove remains between the silicon oxide columns. The method further includes a step of depositing a compound film on an inner wall of the groove to fill the groove with the compound film. In the step of depositing the compound film, a supercritical fluid, in which a compound dissolves, is introduced into the groove to deposit the compound film on the inner wall of the groove. The compound film has a refraction index, which is substantially equal to a refraction index of the silicon oxide column.

Alternatively, in the step of etching the silicon substrate, each column may have a thin plate shape with a longitudinal direction, which extends along with an optical axis of the optical part. The trench has a sidewall in parallel to the longitudinal direction of the column.

Alternatively, in the step of etching the silicon substrate, a surface of the silicon substrate may be etched by using an inductively coupled plasma so that the movable-portion-to-be-formed portion, the support-portion-to-be-formed portion, and the optical-part-to-be-formed portion are formed on the silicon substrate.

Alternatively, the movable portion may include a beam for movably supporting the movable portion to the support portion. In the step of etching the silicon substrate, a beam-to-be-formed portion is formed on the silicon substrate. In the step of removing the part of the movable-portion-to-be-formed portion, a part of the beam-to-be-formed portion connecting to the silicon substrate is removed so that the beam is separated from the silicon substrate. The beam-to-be-formed portion provides the beam.

According to a second aspect of the present disclosure, a physical quantity sensor for detecting a physical quantity includes: a silicon substrate; a light emitting element for emitting a light; an optical part for irradiating the light from the light emitting element as an irradiation light; a movable portion having a reflection surface, wherein the reflection surface reflects the irradiation light as a reflection light, and wherein the movable portion is movable in accordance with the physical quantity applied to the sensor so that an incident angle of the irradiation light with respect to the reflection surface is changed; a support portion for movably supporting the movable portion on the silicon substrate; and a detection element for detecting a change of the reflection light in order to detect the physical quantity. The optical part is made of silicon oxide, and integrated with the silicon substrate. The support portion is made of silicon, and integrated with the silicon substrate. The movable portion is made of silicon, and integrated with the silicon substrate through the support portion. The optical part has a top surface opposite to the silicon substrate. The movable portion has a top surface opposite to the silicon substrate. The top surface of the movable portion and the top surface of the optical part are disposed on almost a same plane.

In the above device, the sensor is easily manufactured so that manufacturing efficiency of the sensor is increased.

Alternatively, the optical part may be one of a micro lens, an optical waveguide and a prism.

Alternatively, the optical part may include two of a micro lens, an optical waveguide and a prism.

Alternatively, the optical part may include multiple pairs of two of a micro lens, an optical waveguide and a prism.

According to a third aspect of the present disclosure, a physical quantity sensor for detecting a physical quantity includes: a silicon substrate; a light emitting element for emitting a light; an optical part for irradiating the light from the light emitting element as an irradiation light; a movable portion having a reflection surface, wherein the reflection surface reflects the irradiation light as a reflection light, and wherein the movable portion is movable in accordance with the physical quantity applied to the sensor so that an incident angle of the irradiation light with respect to the reflection surface is changed; a support portion for movably supporting the movable portion on the silicon substrate; and a detection element for detecting a change of the reflection light in order to detect the physical quantity. The optical part is made of silicon oxide, and integrated with the silicon substrate. The support portion is made of silicon, and integrated with the silicon substrate. The movable portion other than the reflection surface is made of silicon, and integrated with the silicon substrate through the support portion. The reflection surface of the movable portion is made of silicon oxide.

In the above device, the sensor is easily manufactured so that manufacturing efficiency of the sensor is increased.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A method for manufacturing a physical quantity sensor, which includes a movable portion, a support portion and an optical part, wherein the movable portion is movable in a predetermined direction in accordance with a physical quantity applied to the sensor, wherein the movable portion is movably supported on the support portion, wherein the optical part irradiates a light to the movable portion, the light emitted from an external light emitting device and entered into the optical part, and wherein the physical quantity is detected on the basis of detection of the light reflected on the movable portion, the detection performed by an external light detector, the method comprising steps of:

etching a silicon substrate so that a movable-portion-to-be-formed portion, a support-portion-to-be-formed portion, and an optical-part-to-be-formed portion are formed on the silicon substrate, wherein the movable-portion-to-be-formed portion provides the movable portion, the support-portion-to-be-formed portion provides the support portion, and the optical-part-to-be-formed portion provides the optical part, and wherein the optical-part-to-be-formed portion includes a plurality of columns, which are disposed in parallel each other and have a trench between two neighboring columns;

oxidizing the optical-part-to-be-formed portion so that each column changes to a silicon oxide column and the trench is filled with a silicon oxide layer; and removing a part of the movable-portion-to-be-formed portion connecting to the silicon substrate so that the movable portion is separated from the silicon substrate and the movable portion is movably supported on the support portion.

2. The method according to claim 1, wherein the silicon substrate is made of a SOI substrate.

3. The method according to claim 1, wherein the support-portion-to-be-formed portion has a width larger than a width of the movable-portion-to-be-formed portion, and the optical-part-to-be-formed portion has a width larger than the width of the movable-portion-to-be-formed portion.

4. The method according to claim 1, wherein in the step of removing the part of the movable-portion-to-be-formed portion, a part of the support-portion-to-be-formed portion remains to integrally connect to the silicon substrate, and in the step of removing the part of the movable-portion-to-be-formed portion, a part of the optical-part-to-be-formed portion remains to integrally connect to the silicon substrate.

5. The method according to claim 1, wherein in the step of oxidizing the optical-part-to-be-formed portion, the silicon oxide layer and the silicon oxide column are integrated so that the silicon oxide layer and the silicon oxide column provide the optical part, in the step of oxidizing the optical-part-to-be-formed portion, a silicon oxide film is formed on a surface of the silicon substrate, and in the step of removing the part of the movable-portion-to-be-formed portion, the silicon oxide film on the silicon substrate is removed.

6. The method according to claim 1, wherein in the step of removing the part of the movable-portion-to-be-formed portion, the part of the movable-portion-to-be-formed portion connecting to the silicon substrate is etched by using a $XeF_2$ gas.

7. The method according to claim 1, wherein, in the step of oxidizing the optical-part-to-be-formed portion, the trench is partially filled with the silicon oxide layer so that a groove remains between the silicon oxide columns, the method further comprising a step of:

depositing a silicon oxide film in the groove to fill the groove with the silicon oxide film.

8. The method according to claim 7, wherein in the step of depositing the silicon oxide film, a supercritical fluid, in which a silicon oxide dissolves, is introduced into the groove to deposit the silicon oxide film on an inner wall of the groove.

9. The method according to claim 8, wherein the supercritical fluid includes a main component made of carbon dioxide.

10. The method according to claim 8, wherein, in the step of oxidizing the optical-part-to-be-formed portion, the trench is partially filled with the silicon oxide layer so that a groove remains between the silicon oxide columns, the method further comprising a step of:

depositing a compound film on an inner wall of the groove to fill the groove with the compound film, wherein in the step of depositing the compound film, a supercritical fluid, in which a compound dissolves, is introduced into the groove to deposit the compound film on the inner wall of the groove, and the compound film has a refraction index, which is substantially equal to a refraction index of the silicon oxide column.

11. The method according to claim 1, wherein in the step of etching the silicon substrate, each column has a thin plate shape with a longitudinal direction, which extends along with an optical axis of the optical part, and the trench has a sidewall in parallel to the longitudinal direction of the column.

12. The method according to claim 1, wherein in the step of etching the silicon substrate, a surface of the silicon substrate is etched by using an inductively coupled plasma so that the movable-portion-to-be-formed portion, the support-portion-to-be-formed portion, and the optical-part-to-be-formed portion are formed on the silicon substrate.

13. The method according to claim 1, wherein the movable portion includes a beam for movably supporting the movable portion to the support portion, in the step of etching the silicon substrate, a beam-to-be-formed portion is formed on the silicon substrate, in the step of removing the part of the movable-portion-to-be-formed portion, a part of the beam-to-be-formed portion connecting to the silicon substrate is removed so that the beam is separated from the silicon substrate, and the beam-to-be-formed portion provides the beam.

14. The method according to claim 13, wherein the support-portion-to-be-formed portion has a width larger than a width of the movable-portion-to-be-formed portion and larger than a width of the beam-to-be-formed portion, and the optical-part-to-be-formed portion has a width larger than the width of the movable-portion-to-be-formed portion and larger than the width of the beam-to-be-formed portion.

15. The method according to claim 13, wherein
in the step of removing the part of the movable-portion-to-be-formed portion, a part of the support-portion-to-be-formed portion remains to integrally connect to the silicon substrate, and
in the step of removing the part of the movable-portion-to-be-formed portion, a part of the optical-part-to-be-formed portion remains to integrally connect to the silicon substrate.

16. The method according to claim 13, wherein
in the step of oxidizing the optical-part-to-be-formed portion, the silicon oxide layer and the silicon oxide column are integrated so that the silicon oxide layer and the silicon oxide column provide the optical part,
in the step of oxidizing the optical-part-to-be-formed portion, a silicon oxide film is formed on a surface of the silicon substrate, and
in the step of removing the part of the movable-portion-to-be-formed portion, the silicon oxide film on the silicon substrate is removed.

17. The method according to claim 13, wherein
in the step of removing the part of the movable-portion-to-be-formed portion, the part of the movable-portion-to-be-formed portion connecting to the silicon substrate and the part of the beam-to-be-formed portion connecting to the silicon substrate are etched by using a $XeF_2$ gas.

18. The method according to claim 13, wherein, in the step of oxidizing the optical-part-to-be-formed portion, the trench is partially filled with the silicon oxide layer so that a groove remains between the silicon oxide columns, the method further comprising a step of:
depositing a silicon oxide film in the groove to fill the groove with the silicon oxide film.

19. The method according to claim 18, wherein
in the step of depositing the silicon oxide film, a supercritical fluid, in which a silicon oxide dissolves, is introduced into the groove to deposit the silicon oxide film on an inner wall of the groove.

20. The method according to claim 19, wherein
the supercritical fluid includes a main component made of carbon dioxide.

21. The method according to claim 19, wherein, in the step of oxidizing the optical-part-to-be-formed portion, the trench is partially filled with the silicon oxide layer so that a groove remains between the silicon oxide columns, the method further comprising a step of:
depositing a compound film on an inner wall of the groove to fill the groove with the compound film, wherein
in the step of depositing the compound film, a supercritical fluid, in which a compound dissolves, is introduced into the groove to deposit the compound film on the inner wall of the groove, and
the compound film has a refraction index, which is substantially equal to a refraction index of the silicon oxide column.

22. The method according to claim 13, wherein
in the step of etching the silicon substrate, each column has a thin plate shape with a longitudinal direction, which extends along with an optical axis of the optical part, and
the trench has a side wall in parallel to the longitudinal direction of the column.

23. The method according to claim 13, wherein
in the step of etching the silicon substrate, a surface of the silicon substrate is etched by using an inductively coupled plasma so that the movable-portion-to-be-formed portion, the support-portion-to-be-formed portion, the optical-part-to-be-formed portion and the beam-to-be-formed portion are formed on the silicon substrate.

* * * * *